(12) United States Patent
Bayruns et al.

(10) Patent No.: US 10,566,449 B2
(45) Date of Patent: Feb. 18, 2020

(54) DUAL-OPERATION DEPLETION/ENHANCEMENT MODE HIGH ELECTRON MOBILITY TRANSISTOR

(71) Applicant: DUET MICROELECTRONICS LLC, Raritan, NJ (US)

(72) Inventors: John Bayruns, Raritan, NJ (US); Robert J. Bayruns, Raritan, NJ (US); Ashok T. Ramu, Raritan, NJ (US)

(73) Assignee: Duet Microelectronics, Inc., Raritan, NJ (US)

( * ) Notice: Subject to any disclaimer, the term of this patent is extended or adjusted under 35 U.S.C. 154(b) by 0 days.

(21) Appl. No.: 15/958,579

(22) Filed: Apr. 20, 2018

(65) Prior Publication Data

US 2019/0326425 A1    Oct. 24, 2019

(51) Int. Cl.
| | |
|---|---|
| H01L 31/072 | (2012.01) |
| H01L 31/109 | (2006.01) |
| H01L 29/778 | (2006.01) |
| H01L 27/088 | (2006.01) |
| H01L 29/10 | (2006.01) |
| H01L 29/66 | (2006.01) |

(52) U.S. Cl.
CPC ...... *H01L 29/7784* (2013.01); *H01L 27/0883* (2013.01); *H01L 29/1095* (2013.01); *H01L 29/66431* (2013.01)

(58) Field of Classification Search
CPC ............. H01L 29/66462; H01L 29/778; H01L 29/66431; H01L 29/7783; H01L 29/1029; H01L 29/7784; H01L 29/1075; H01L 29/0843; H01L 29/1058; H01L 29/1095

USPC .......................................................... 257/194
See application file for complete search history.

(56) References Cited

U.S. PATENT DOCUMENTS

2001/0002706 A1* 6/2001 Hase ................... H01L 29/7785
                                                          257/192

OTHER PUBLICATIONS

Boroumand et al., "Observations of Backgate Impedance Dispersion in GaAs Isolation Structures", IEEE Transactions on Electron Devices, vol. 48, No. 9, Sep. 2011, pp. 1850-1858.
(Continued)

*Primary Examiner* — Theresa T Doan
(74) *Attorney, Agent, or Firm* — John H. Choi & Associates (57) ABSTRACT

The present invention is a FET having a p-doped or acceptor-doped layer underneath a FET channel to enable E/D Mode operation. A FET threshold voltage is tunable through a voltage applied to the p-doped layer via a metal contact such as a threshold-control terminal (TCT). The present invention has a dual E/D mode operation of a single FET device, and also a dual E/D mode operation with a single-polarity positive power supply voltage. The FET of the present invention is fabricated to enable dual enhancement-mode/depletion-mode (E-Mode/D-Mode) high electron mobility transistors (HEMTs), to enable dual E/D Mode operation by incorporating a p-doped or acceptor doped region underneath the channel, to achieve a tunable threshold voltage by varying the bias voltage on a fourth terminal called the threshold-control terminal (TCT) that contacts the p-doped layer, and to enable Dual E/D-Mode operation of a HEMT with a single-polarity positive power supply voltage.

18 Claims, 9 Drawing Sheets

(56) References Cited

OTHER PUBLICATIONS

Kocot et al., "Backgating in GaAs Mesfet's", IEEE Transactions on Microwave Theory and Techniques, vol. MTT-30, No. 7, Jul. 1982, pp. 963-968.
Chen et al., "Reduction of Sidegating in GaAs Analog and Digital Circuits Using a New Buffer Layer", IEEE Transactions on Electron Devices, vol. 36, No. 9, Sep. 1989, pp. 1546-1556.
Kawaharazuka et al., Study of Free GaAs Surfaces Using a Backgated Undoped GaAs/AlGaAs Heterostructure, Physica E, vol. 13, 2002, pp. 663-666.
Norman Fadhil Idham et al., "Device Characteristics of HEMT Structures Based on Backgate Contact Method", ICSE2006 Proc. 2006, pp. 740-742.
Bayruns et al., "The Bootstrapped Gate FET (BGFET)—A New Control Transistor", GaAs IC Symposium, 1995, pp. 136-139.
Abey et al., "A Single Supply High Performance PA MMIC for GSM Handsets using Quasi-Enhancement Mode PHEMT", IEEE MTT-S Digest, 2001, pp. 923-926.
Lin et al., "A Delta-Doped InGaP/InGaAs PHEMT with Different Doping Profiles for Device-Linearity Improvement", IEEE Transactions on Electron Devices, vol. 54, No. 7, Jul. 2007, pp. 1617-1625.

\* cited by examiner

DUAL-OPERATION DEPLETION/ENHANCEMENT MODE HIGH ELECTRON MOBILITY TRANSISTOR

FIELD

The present disclosure relates to transistors and in particular to a dual-operation depletion/enhancement mode high electron mobility transistor.

BACKGROUND

Figure 1A:
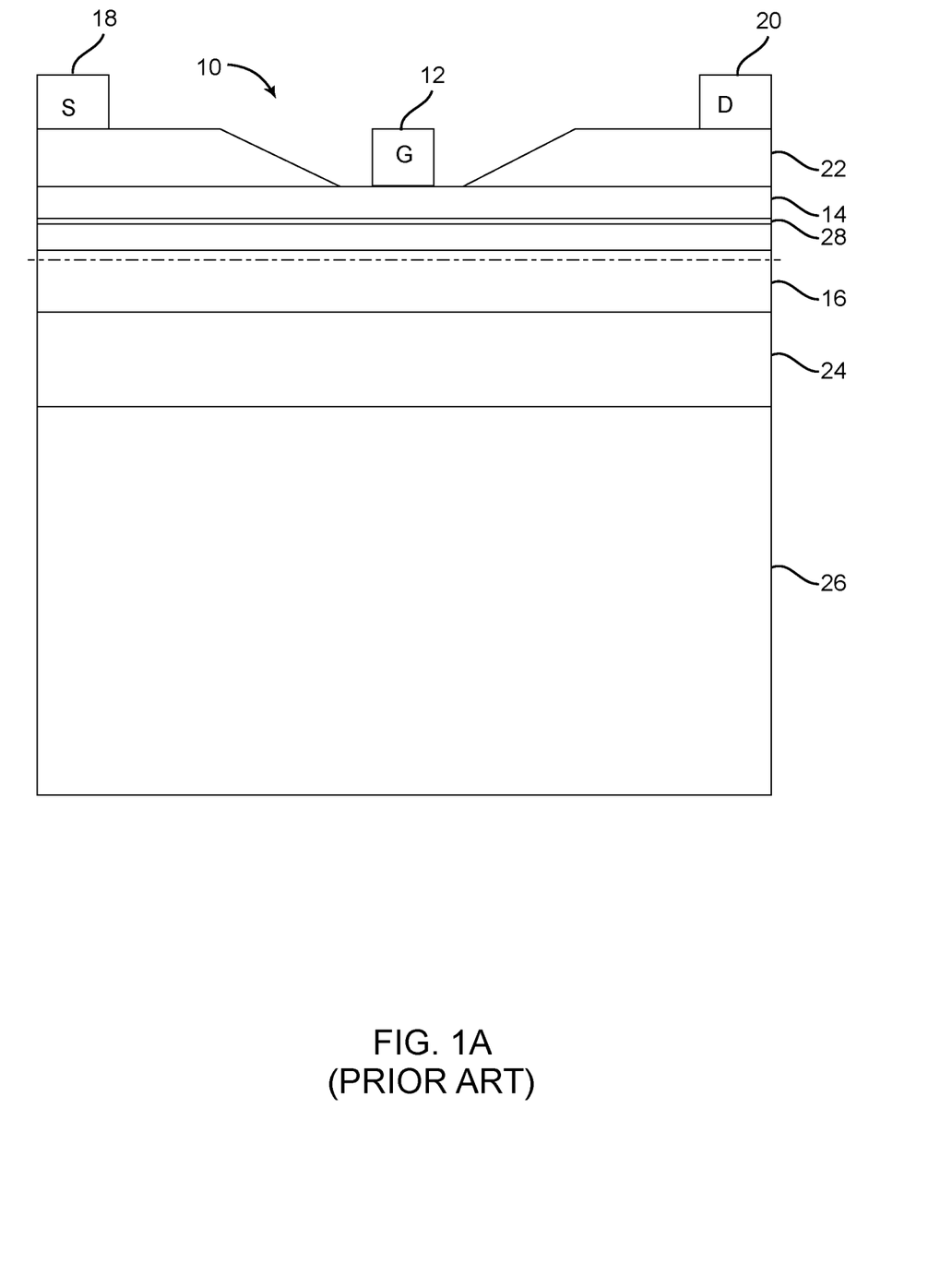
FIG. 1a illustrates a FET in the prior art.

Field-effect transistors (FETs), that exemplify solid-state electronic transistors, are three-terminal devices that operate based on the field effect. Referring to FIG. 1a, when operating a FET 10, a voltage applied to a terminal 12 called the "Gate Electrode" acts on mobile charge carriers remotely through a front barrier 14 which may be insulating, weakly conducting, or semiconducting. The mobile charge carriers get pulled into/depleted from a "channel" region 16, by means of electrostatic fields.

The gate electrode 12 may form or disrupt a conductive "bridge" in the channel region 16 between two other terminals 18, 20 called the "Source Electrode" and the "Drain Electrode", respectively, depending on: (a) the voltage magnitude and voltage polarity applied externally to the gate electrode 12; (b) the polarity of charge being pulled into, or depleted from, the channel 16 by the gate 12 (negative for electrons, positive for electron vacancies also known as "holes"); and (c) the polarity and quantity of immobile fixed charges either present in the channel 16 or in the front barrier 14. Other structures of the FET 10 may include a conducting cap 22 disposed on the front barrier 14, which in turn is disposed on the channel 16. The channel 16 may be disposed on a back barrier 24, which in turn is disposed on a substrate 26. A pulse doping layer 28 may be disposed within the front barrier 14, with the pulse doping layer 28 being, for example, an n++ or donor of electrons traveling from the source 18 to the drain 20.

For clarity of exposition, as described herein, an arrangement where a "HIGH" voltage applied to the gate terminal 12 attracts negatively charged electrons into an otherwise weakly conducting channel 16, thereby forming a conducting path that electrically bridges the electron-rich source 18 and drain 20. On the other hand, application of a "LOW" gate voltage would then disrupt the conducting path, thus electrically isolating the source 18 and drain 20. This is called an n-channel FET, meaning that the carriers of electric current are negatively charged electrons.

FETs are classified as depletion-mode ("D-Mode") or enhancement-mode ("E-Mode") transistors based on the maximum value of the "LOW" voltage beyond which appreciable conduction occurs. If the device starts conducting at a "LOW" voltage which is negative, it is called a D-Mode FET. If it takes a positive "LOW" voltage for the device to start conducting, so that there is no appreciable current when the gate is at 0 Volt, it is called an E-Mode FET.

Figure 2:
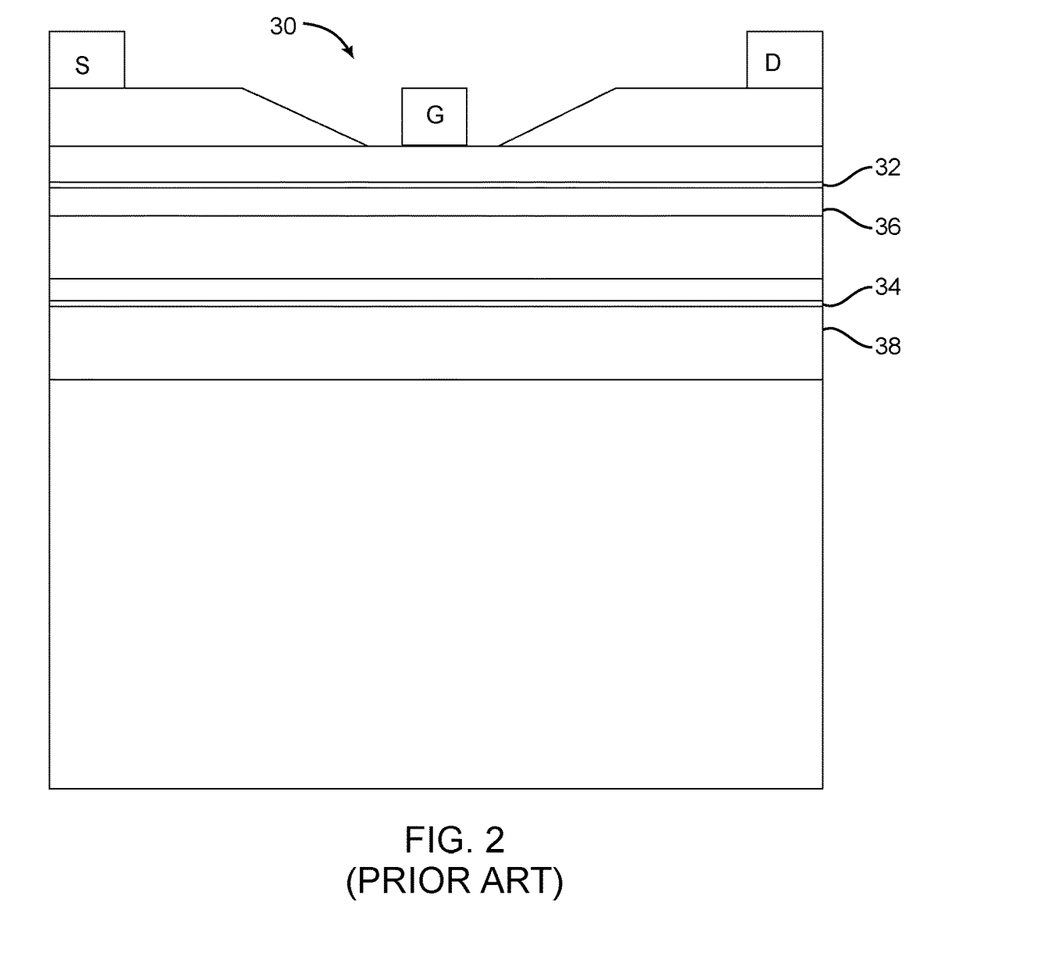
FIG. 2 illustrates a FET with front and back barriers with pulse doping.

A high-electron mobility transistor (HEMT) in the prior art is illustrated in FIG. 1a, which is a FET in which the front barrier 14 is a semiconductor as well, usually an alloy different in elemental composition from the material of the channel 14. With a semiconducting front barrier 14, it is easier in practice to insert fixed electrical charges that would further modulate the response of electrons in the channel 16 to the gate voltage. A variant of the basic HEMT structure in the prior art, shown as the FET 30 in FIG. 2, features two delta-doped layers 32, 34, one in each barrier 36, 38, respectively, such as described in Lin et al., "A Delta-Doped InGaP/InGaAs PHEMT with Different Doping Profiles for Device-Linearity Improvement", IEEE TRANSACTIONS ON ELECTRON DEVICES, Vol. 54, No. 7, July 2007, pp. 1617-1625.

The operation of the FET is best visualized by means of a partial "band energy diagram", which is the energy of the edge of the conduction band (CB) pictured as a function of spatial position. The band energy diagrams, such as shown in FIG. 1d, are constructed such that, under the prevalent electrostatic fields, electrons tend to pool near the bottom of the profile. The dashed lines show the "chemical potential" (also known as Fermi level) which may be considered an energy reference for the CB. It is important to note that the lower the CB energy relative to this reference at any point, the larger the electron concentration at that point.

FIG. 1d shows the band energy diagram in a vertical section through the center of FIG. 1a, cutting through the gate metal, front barrier, channel, back barrier and substrate. The barriers are made of a semiconductor of a different material or alloy composition than the channel. An example plot of material elemental composition vs. vertical location is illustrated in FIG. 1e. As shown in FIG. 1d, with such a material stack, a conduction band "well" forms at the barrier-channel interface, where electrons can be made to pool by increasing the gate voltage, as explained below. This pool of electrons, once created by applying a large enough gate voltage, would bridge the source and drain terminals and allow an electrical current.

Figure 1B:
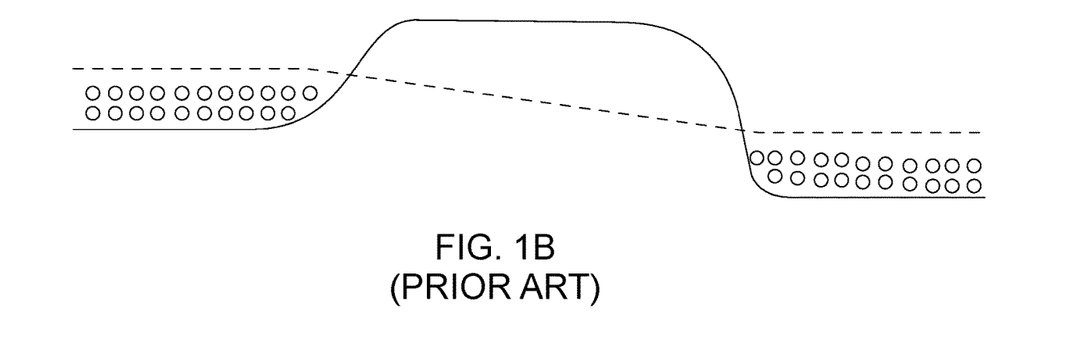
Figure 1C:
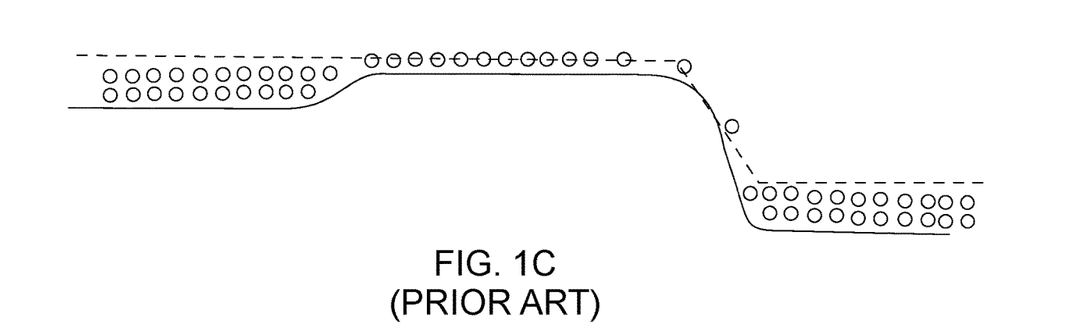
Figure 1D:
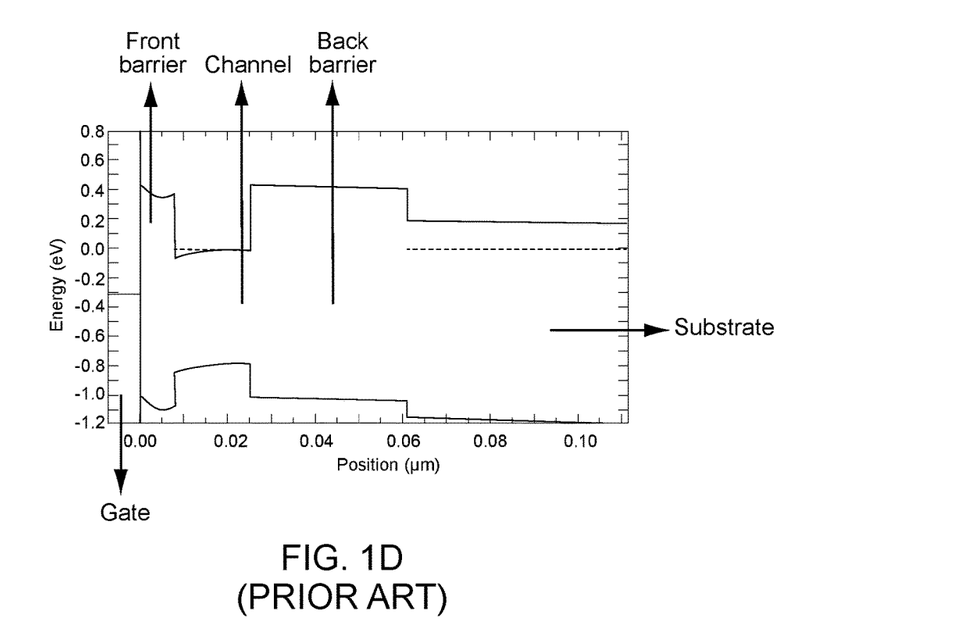
Figure 1E:
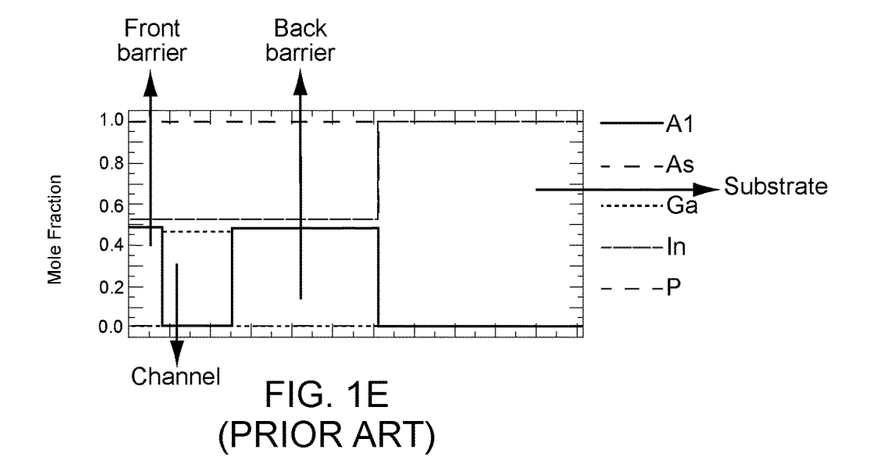

FIGS. 1b-1c show schematically the CB energy as a function of position in the channel, across the device of FIG. 1a from source to drain terminals. If the gate voltage is very low, the CB energy in the channel under the gate electrode is high, presenting a potential step that blocks electrons from transferring from source to drain, even if the drain CB energy is lower than that of the source. As the gate voltage increases, the step height decreases, until a threshold gate voltage is reached. At this threshold voltage (also known as "pinch-off voltage"), electrons in the source can gain enough energy from random thermal excitations to overcome the step, as shown in FIG. 1c, after which they are accelerated by the drain voltage into the drain terminal, providing current at the drain terminal.

Figure 3A:
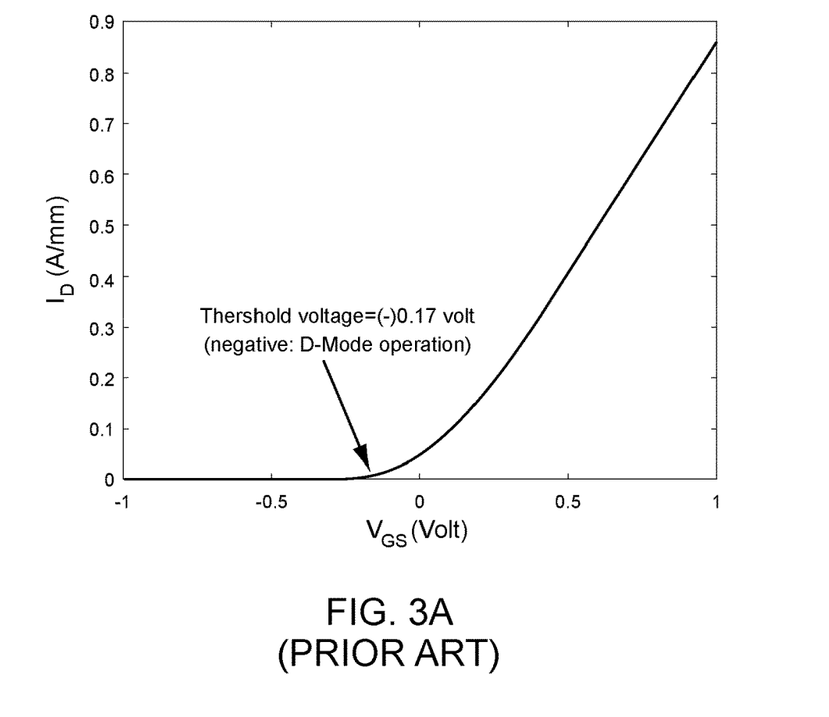
FIG. 3a illustrates an $I_D$ vs. $V_{GS}$ chart for a depletion-mode HEMT.
Figure 3B:
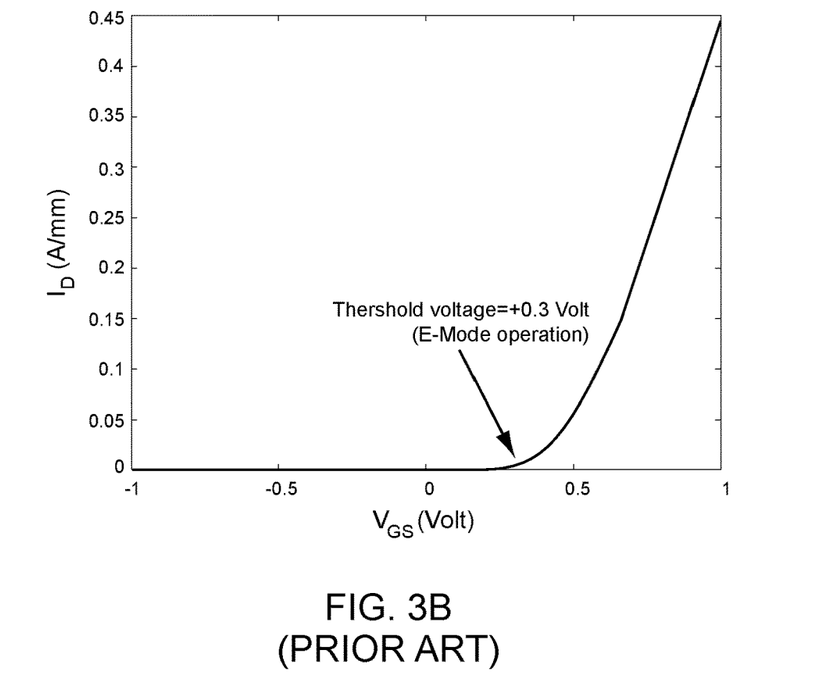
FIG. 3b illustrates an $I_D$ vs. $V_{GS}$ chart for an enhancement-mode HEMT.

FIG. 3a-3b display exemplary plots of the drain current $I_D$ versus the gate-to-source voltage $V_{GS}$. The source is chosen to be the zero of potential throughout the present disclosure. A fixed positive voltage is applied to the drain to collect the electrons launched from the source. This drain voltage is often close to the highest DC voltage in the system, such as the positive power supply rail. As described herein, a threshold voltage is present during which the drain current is small, followed by an abrupt increase as the potential step becomes low enough to be surmounted by electrons thermally excited from the source. Beyond this point, the current at the drain monotonically increases as the increasing gate voltage attracts more and more electrons into the channel. FIG. 3a represents a D-Mode FET, since the threshold voltage for conduction to begin is negative, while FIG. 3b represents an E-Mode FET, since the threshold voltage is positive.

In the prior art, the influence of FET electrical characteristics by another terminal, different from the source, drain, and gate, has long been investigated as a nuisance effect. The other terminal, as a "fourth terminal", considered in the prior art typically belongs to a different device on the same chip, causing nominally isolated devices on the same chip to become electrically coupled. This coupling is through (a)

direct current injection by the fourth terminal, (b) indirect modulation of the channel potential through charging or discharging interface traps beneath the channel, or (c) direct electrostatic modulation of the channel potential. Such unwanted coupling to a fourth terminal has been labelled "back-gating" or "side-gating" in the prior art, such as in Boroumand et al., "Observations of Backgate Impedance Dispersion in GaAs Isolation Structures", IEEE TRANSACTIONS ON ELECTRON DEVICES, Vol. 48, No. 9, September 2011, pp. 1850-1858; Kocot et al., "Backgating in GaAs MESFET's", IEEE TRANSACTIONS ON MICROWAVE THEORY AND TECHNIQUES, Vol. MTT-30, No. 7, July 1982, pp. 963-968; and Chen et al., "Reduction of Sidegating in GaAs Analog and Digital Circuits Using a New Buffer Layer", IEEE TRANSACTIONS ON ELECTRON DEVICES, Vol. 36, No. 9, September 1989, pp. 1546-1556. Effect (c) has been neglected in such studies since typical inter-device separations are on the order of tens of microns. Occasionally, a substrate contact is termed the "back-gate", as described in the prior art in Norman Fadhil Idham et al., "Device Characteristics of HEMT Structures Based on Backgate Contact Method", ICSE2006 Proc. 2006, pp. 740-742; but its large distance from the channel, on the order of hundreds of microns, and its isolation due to the highly resistive substrate makes the substrate contact unusable for purposes of threshold voltage control.

An underlying n-doped (donor-doped) layer has been utilized as an investigative tool to examine charge-potential characteristics of free GaAs surfaces, as described in the prior art such as Kawaharazuka et al., "Study of Free GaAs Surfaces Using a Back-gated Undoped GaAs/AlGaAs Heterostructure, PHYSICA E, Vol. 13, 2002, pp. 663-666. The Kawaharazuka reference (a) describes essentially a 3-terminal device viewed upside-down, and (b) serves a different purpose to that in the present inventive disclosure. Additionally, it is to be noted that n-doped layers, if attempted to be used as threshold-control terminal (TCT) access layers, are incompatible with dual E/D-Mode operation with a single power supply. This is because E-mode operation in such a hypothetical device would need a negative voltage applied to the n-doped layer.

A highly resistive p-doped layer underneath the channel has been reported in a MESFET device, such as described in Bayruns et al., "The Bootstrapped Gate FET (BGFET)-A New Control Transistor", GaAs IC Symposium, 1995, pp. 136-139. Its purpose was to improve the linearity of the FET current-voltage characteristics under high-frequency operation. The high resistivity required of the p-doped layer for realizing such a linear FET would make for a poorly controlled threshold voltage in the the present inventive disclosure.

Earlier attempts at single power-supply FET operation have utilized quasi-enhancement mode FETs. These have a slightly positive threshold voltage, so that the current drawn when nominally off; i.e. the gate voltage is 0 volts, is smaller than when nominally on, but not negligible. Special additional circuitry is required to prevent off-state power dissipation, as described in the prior art in Abey et al., "A Single Supply High Performance PA MMIC for GSM Handsets using Quasi-Enhancement Mode PHEMT", IEEE MTT-S Digest, 2001, pp. 923-926.

SUMMARY

The following presents a simplified summary of some embodiments of the invention in order to provide a basic understanding of the invention. This summary is not an extensive overview of the invention. It is not intended to identify key/critical elements of the invention or to delineate the scope of the invention. Its sole purpose is to present some embodiments of the invention in a simplified form as a prelude to the more detailed description that is presented later.

The present invention is a FET having a p-doped (acceptor-doped) layer underneath a FET channel to enable E/D Mode operation. A FET threshold voltage is tunable through a voltage applied to the p-doped layer via a metal contact such as a threshold-control terminal (TCT). The present invention has a dual E/D mode operation of a single FET device, and also a dual E/D mode operation with a single-polarity positive power supply voltage.

The FET of the present invention is fabricated to enable dual enhancement-mode/depletion-mode (E-Mode/D-Mode) high electron mobility transistors (HEMTs), to enable dual E/D Mode operation by incorporating a p-doped (acceptor doped) region underneath the channel, to achieve tunable threshold voltage by varying the bias voltage on a fourth terminal called the threshold-control terminal (TCT) that contacts the p-doped layer, and to enable Dual E/D-Mode operation of a HEMT with a single-polarity positive power supply voltage.

In one embodiment, the present invention includes a field-effect transistor (FET) comprising: a substrate; a back barrier disposed on the substrate; a middle barrier disposed above the back barrier, wherein at least one pulse-doping layer is disposed within the middle barrier; a channel disposed on the middle barrier; and a front barrier disposed on the channel. A threshold-control terminal (TCT) access layer is disposed between the middle barrier and the back barrier, wherein a voltage applied to the TCT access layer tunes a threshold voltage of the FET. A front hole-blocker layer is disposed between the middle barrier and the TCT access layer. A spacer layer is disposed between the middle barrier and the TCT access layer. A back hole-blocker layer is disposed between the back barrier and the TCT access layer. A spacer layer is disposed between the back barrier and the TCT access layer. The front barrier includes at least one pulse-doping layer disposed therein. A substrate contact is included upon which the substrate is disposed.

In an alternative embodiment, an n-doped threshold-control terminal (TCT) access layer is disposed between the middle barrier and the back barrier, wherein a voltage applied to the TCT access layer tunes the threshold voltage of the FET. The carriers of electrical current in the FET channel are electron-holes.

In another embodiment, the channel is doped, which acts as a bridge between the source and the drain. A source terminal and a drain terminal are included, wherein the bridge is disrupted by "depleting" the channel through the application of a voltage opposite in polarity to that of the ionized impurities functioning as the dopants of the doped channel. The FET is selected from a hetero-junction FET (HFET), a junction gate FET (JFET), and a metal-semiconductor FET (MESFET).

In another embodiment, a p-doped threshold-control terminal (TCT) access layer, a spacer layer, and a hole-blocking layer are included, wherein at least one of the p-doped TCT access layer, the spacer layer, the hole-blocking layer, the channel, the front barrier, the middle barrier, and the back barrier is composed of a compound selected from (In)GaAs, (In)GaP, (Ga)AlAs, (Al)InAs, (In)GaN or (Ga)AlN. The substrate is composed of a compound selected from GaAs, InP, GaN, Si, SiC or $Al2O_3$.

In an alternative embodiment, the present invention includes a field-effect transistor (FET) comprising: a substrate; a back barrier disposed on the substrate; a threshold-control terminal (TCT) access layer disposed above the back barrier, wherein a voltage applied to the TCT access layer tunes a threshold voltage of the FET; a middle barrier disposed above the TCT access layer, wherein at least one pulse-doping layer is disposed within the middle barrier; a channel disposed on the middle barrier; a front barrier disposed on the channel; and a gate disposed on the front barrier. The TCT access layer is p-doped. A TCT contact is disposed on the TCT access layer.

In another alternative embodiment, the present invention includes a method for fabricating a field-effect transistor (FET) comprising: providing a substrate; disposing a back barrier on the substrate; disposing a threshold-control terminal (TCT) access layer above the back barrier; disposing a middle barrier above the TCT access layer; disposing at least one pulse-doping layer within the middle barrier; disposing a channel on the middle barrier; disposing a front barrier on the channel; and applying a voltage to the TCT access layer, thereby tuning a threshold voltage of the FET.

BRIEF DESCRIPTION OF DRAWINGS

The foregoing summary, as well as the following detailed description of presently preferred embodiments of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In addition, some of the figures are provided further details including exemplary dimensions which are in units of inches.

In the drawings:

FIGS. 1b-1c illustrate conduction band profiles across the FET of FIG. 1a;

FIG. 1d illustrates a conduction band profile through the center of the FET of FIG. 1a;

FIG. 1e illustrates a material composition profile through the center of the FET of FIG. 1a;

FIG. 5b illustrates a variant of the HEMT of FIG. 5a;

To facilitate an understanding of the invention, identical reference numerals have been used, when appropriate, to designate the same or similar elements that are common to the figures. Further, unless stated otherwise, the features shown in the figures are not drawn to scale, but are shown for illustrative purposes only.

DETAILED DESCRIPTION

Certain terminology is used in the following description for convenience only and is not limiting. The article "a" is intended to include one or more items, and where only one item is intended the term "one" or similar language is used. Additionally, to assist in the description of the present invention, words such as top, bottom, side, upper, lower, front, rear, inner, outer, right and left are used to describe the accompanying figures. The terminology includes the words above specifically mentioned, derivatives thereof, and words of similar import.

Figure 4:
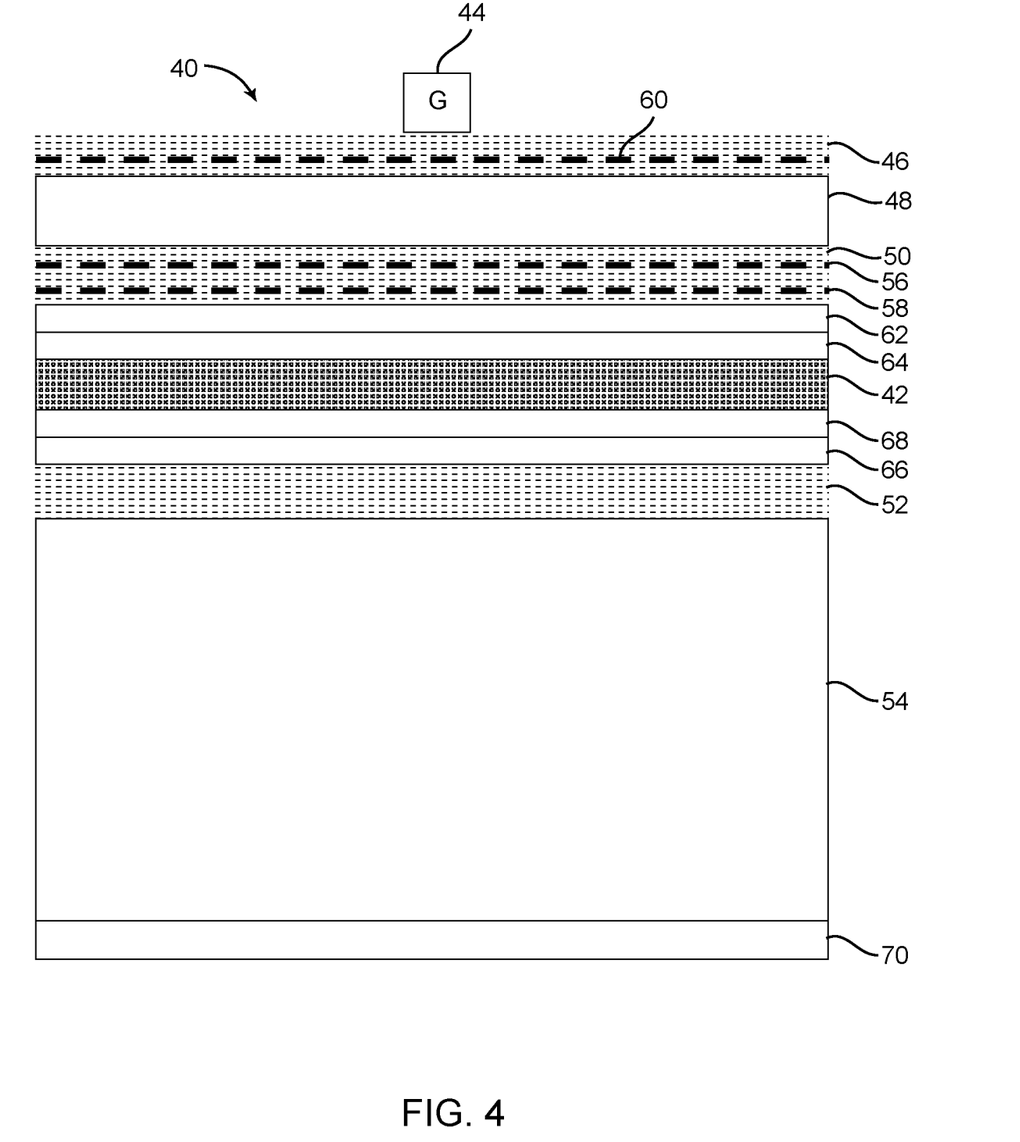
FIG. 4 illustrates an FET of the present invention having a middle barrier.

As illustrated in FIG. 4, the present invention is a HEMT 40 with a TCT-contacting p-doped layer 42. Referring to FIG. 4, a gate 44 is disposed on a front barrier 46, which in turn is disposed on a channel 48. The channel 48 is disposed on a middle barrier 50, which is disposed on the p-doped layer 42. The p-doped layer 42 is disposed on a back barrier 52, which in turn is disposed on a substrate 54. The middle barrier 50 includes at least one pulse doping layer 56, 58. The front barrier 46 may optionally include a pulse doping layer 60. An optional front hole-blocker 62 and/or an optional first undoped spacer 64 may be included between the middle barrier 50 and the TCT-contacting p-doped layer 42. Similarly, an optional back hole-blocker 66 and/or an optional second undoped spacer 68 may be included between the TCT-contacting p-doped layer 42 and the back barrier 52. In addition, a substrate contact 70 may optionally be included under the substrate 54.

In an alternative embodiment, the back barrier 52 may optionally be pulse-doped, which will further reduce hole injection into the substrate 54. If the TCT-access layer 42 is p-doped, then the pulse-doped back barrier 52 is n-doped. Alternatively, if the TCT-access layer 42 is n-doped, then the pulse-doped back barrier 52 is p-doped.

In an example embodiment, the front barrier 46 is composed of AlGaAs, the channel 48 is composed of (In)GaAs, the middle barrier 50 is composed of AlGaAs, the optional front hole-blocker 62 is composed of AlAs, the optional first undoped spacer 64 is composed of (In)GaAs, the TCT-access p-doped layer 42 is also composed of (In)GaAs, the optional second spacer 68 is also composed of (In)GaAs, the optional back hole-blocker 66 is composed of AlAs, the back barrier 52 is composed of AlGaAs, and the substrate 54 is composed of GaAs. However, other alternative embodiments may use different materials, instead of (In)(Al)GaAs layers on GaAs substrates as described herein. The FETs of the present invention do not depend on any special properties of (In)(Al)GaAs not present in other compound semiconductors or alloys, nor on any specific properties of GaAs as a substrate.

Figure 6A:
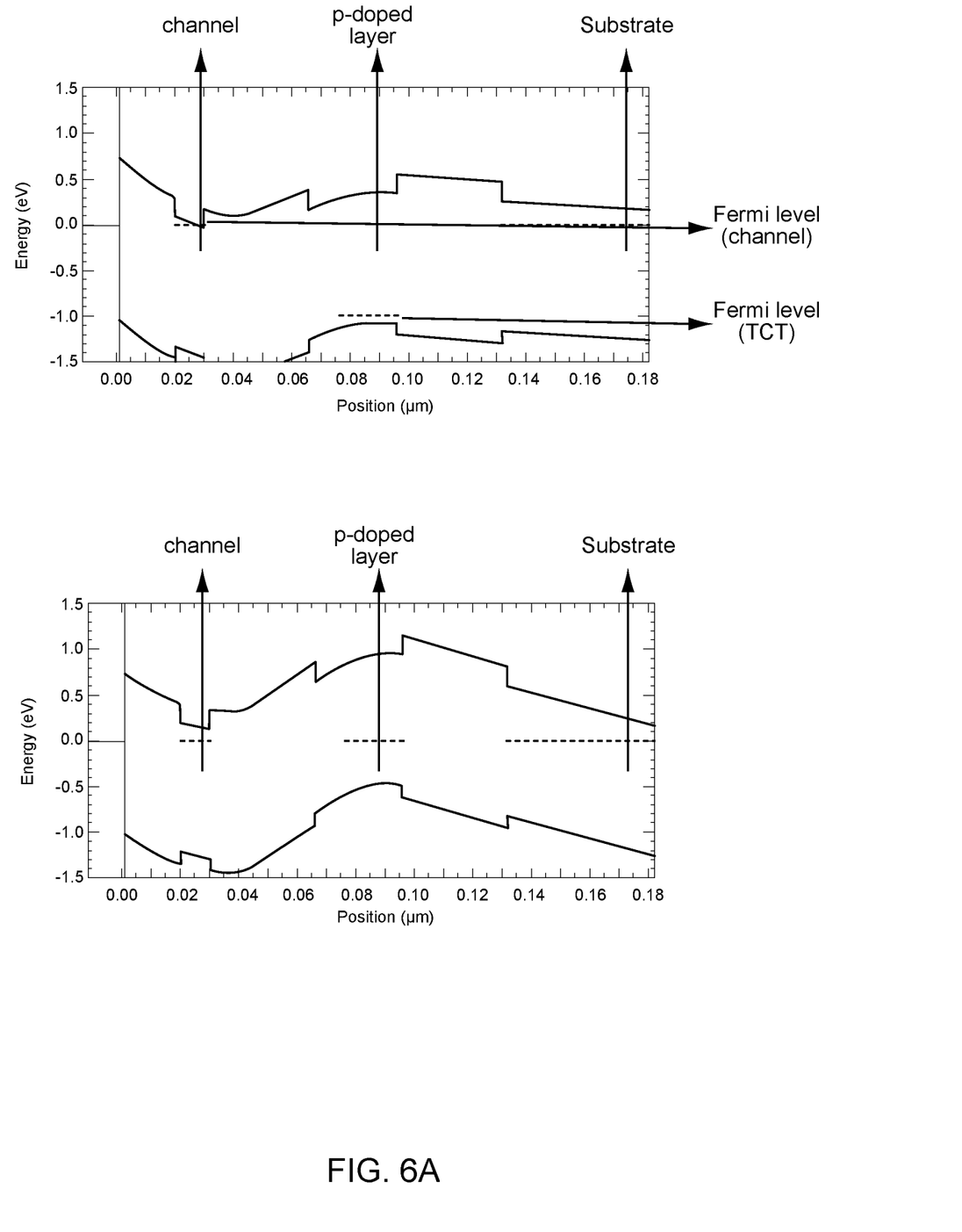
FIG. 6a illustrates an energy band diagram of the FET of FIG. 4.

FIG. 6a shows the conduction band energy diagram with 1 volt on the TCT in the top diagram, and 0 volt on the TCT in the bottom diagram for the HEMT 40 in FIG. 4. In both cases in FIG. 6a, the channel 48 is kept at 0 volt. In many cases, the p-doped layer 42 would be between about 20 nm and about 2 microns in thickness, and is disposed on the substrate 54. With 0 volt on the TCT, it is seen that the p-doped layer 42 (which is depleted of holes resulting in a net fixed, immobile negative charge) pulls the conduction band in the channel up and away from the Fermi level of the TCT, as in the bottom diagram in FIG. 6a. This causes the electron concentration in the channel to fall too low for the channel 48 to serve as a conductive path from source to drain. It can also be thought of as the immobile negative charges repelling electrons away from the channel 48. Thus with 0 volt on the TCT, applying zero volts on the gate, turns the device "OFF"; in other words, the FET 40 operates in E-Mode.

Referring again to FIG. 6a, with 1 volt on the TCT, the p-doped layer 42 gets less depleted of holes, resulting in too few negative immobile charges to sustain sufficient repulsion of channel electrons. In the alternative "band diagram" view in the top diagram of FIG. 6a, the conduction band-edge in the channel 48 gets pulled down towards and below the Fermi level. This causes the electron concentration in the channel 48 to increase, thus enabling the channel 48 to serve as a conductive path from source to drain. Thus with 1 volt on the TCT, just 0 volt on the gate is enough to turn the device "ON"; in other words, the FET 40 operates in D-Mode.

Figure 6B:
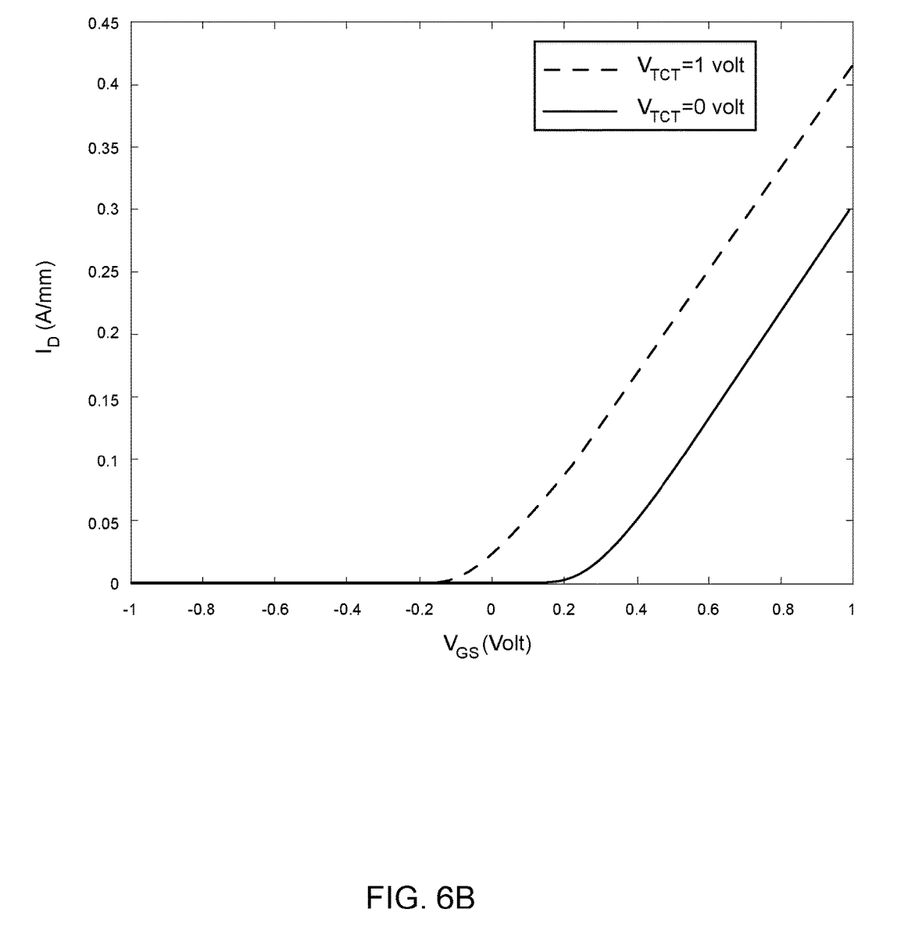
FIG. 6b illustrates a chart of a dual D/E-Mode operation of the FET of FIG. 4.

FIG. 6b shows the $I_D$ vs $V_{GS}$ characteristics of the FET 40 at 0 volt and 1 volt on the TCT, showing a clear transition from E-Mode to D-Mode operation. The operation of the TCT is not discrete, or "digital", and so the TCT voltage can be continuously tuned to achieve the desired threshold voltage of the FET 40, be it strongly E-Mode, be it strongly D-Mode, or be it somewhere in-between, as dictated by the needs of the application circuit.

One issue with biasing a p-type region with a positive voltage is that such biasing would inject holes into the surrounding layers, either into the channel or into the substrate, causing parasitic drain current, noise, and back-gating by modulation of any interface trap charges. Referring to FIG. 4, the example FET 40 is fabricated in order to prevent hole injection from the p-doped layer 42, by surrounding the layer 42 on both sides by AlGaAs barriers as the middle barrier 50 and the back barrier 52. Even higher TCT voltages may be achieved by using a wide band-gap material such as AlAs on either side of the p-doped channel 48, which offers an even larger barrier, for example, up to about 2 eV, for holes to surmount if the holes are to cross over into the valence bands of adjacent layers. These "hole-blocking" layers 62, 66 shown in FIG. 4 on either side of the p-doped layer 42 would range in thickness from about 2 nm to about 20 nm.

Additional undoped spacers 64, 68 around the p-doped region, as shown in FIG. 4, may be used to further tailor the threshold voltage as a function of TCT voltage, and to provide etch-stops for easier fabrication of TCT contacts.

Figure 5A:
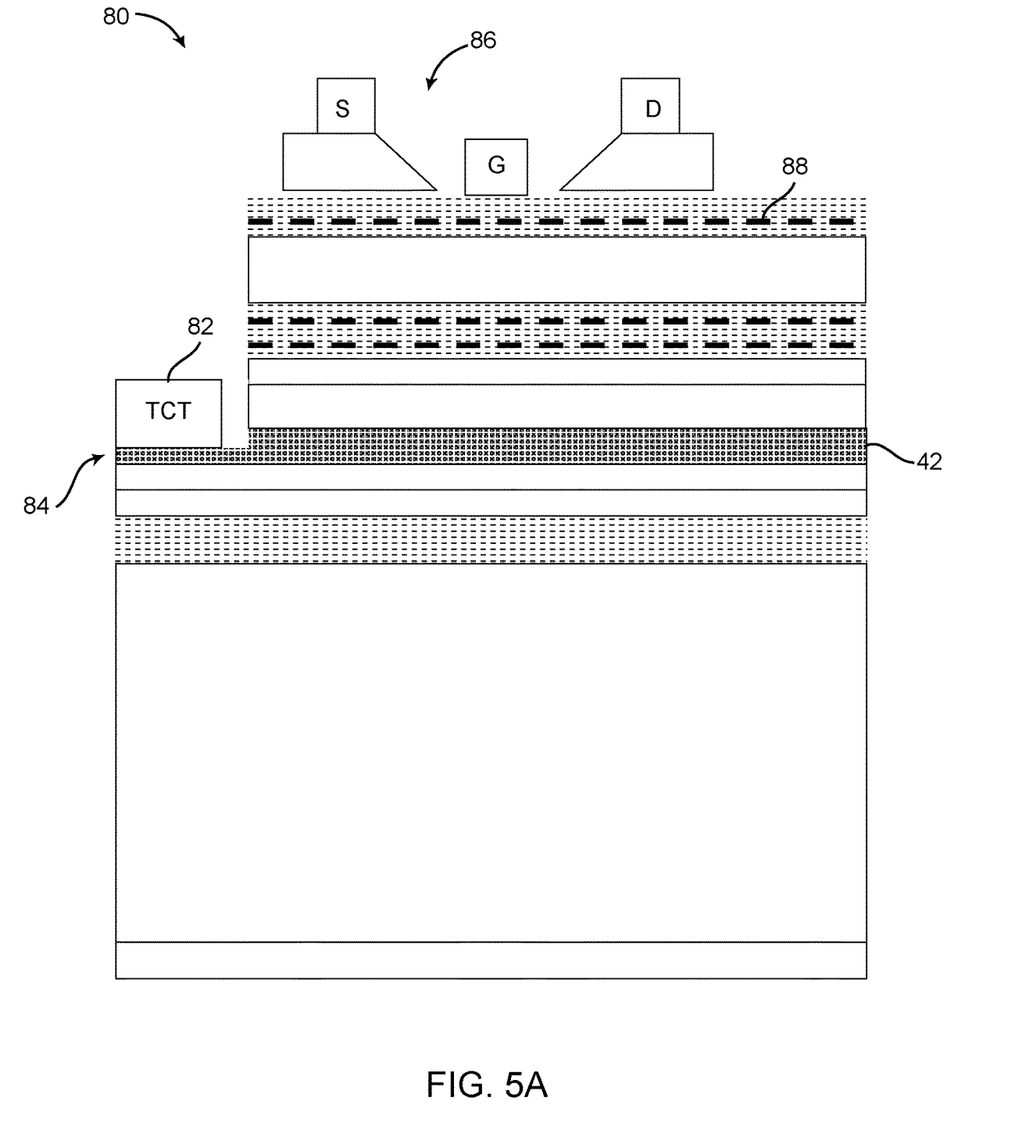
FIG. 5a illustrates an HEMT of the present invention with a mesa.
Figure 5B:
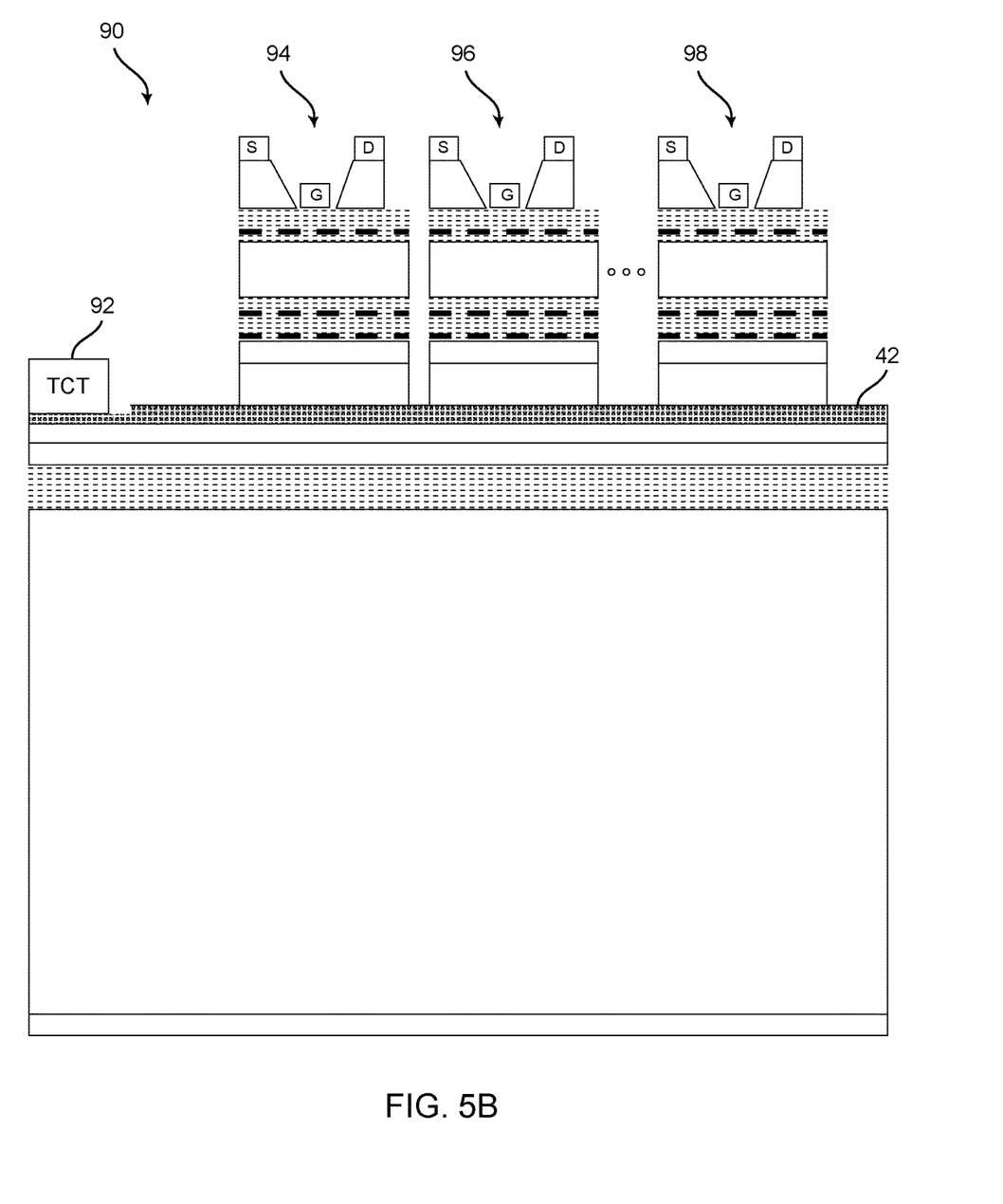

The present invention is also directed to a method of fabrication of a TCT-FET. FIGS. 5a-5b shows schematics of alternative devices 80, 90, respectively, fabricated based on the structure of FIG. 4, with the p-doped region 42 contacted by a metal to form TCT contacts 82, 92, respectively. Standard photolithography, wet or dry chemical etching, and/or metallization processes may be used to form these TCT contacts 82, 92. FIG. 5a illustrates a FET 80 which features a TCT contact 82 fabricated on a separate mesa 84 for each individual device 86. As described herein, an optional pulse doping layer 88 is disposed in a front barrier of the device 86. FIG. 5b illustrates a FET 90 which features a universal TCT contact 92 for all devices 94, 96, 98 combined.

With an appropriate choice of materials, dimensions and fabrication processes, the inventive devices 80, 90 in FIGS. 5a-5b, respectively, may be expected to yield a threshold voltage tunable between about −2 to about +2 volt, using about 0 to about +10 volt applied to the TCT contacts 82, 92, respectively.

In the preferred embodiment, the threshold voltage is tunable between a lower value ranging from about −0.5 to about −0.1 volt, and an upper value ranging from about +0.1 to about +0.7 volt, using about 0 to about +1 volt applied to the TCT contacts 82, 92. This would enable dual E/D Mode operation on a single FET with a single-polarity (positive-only) power supply.

In alternative embodiments, the present invention includes different flavors of FETs apart from HEMTs. In one alternative embodiment, counter-doped layers are disposed underneath the channel that modify the threshold voltage in hole-channel (p-channel) FETs when the carriers of electrical current are holes rather than electrons. The TCT access layer would then be n-doped.

In another alternative embodiment, doped TCT-access layers are disposed underneath the channel that enable tunability of the threshold voltage in FETs that deplete a doped channel, i.e. a pre-existing bridge between the source and drain, by applying a voltage opposite in polarity to the ionized impurities (dopants). These include Hetero-Junction FETs (HFET), a junction gate FET (JFET) and Metal-Semiconductor FETs (MESFETs).

Further alternative embodiments include FETs in which the various layers, including the p-doped layer, the spacers, the hole-blocking layers, the channel, the barriers are composed of (In)GaAs, (In)GaP, (Ga)AlAs, (Al)InAs, (In)GaN or (Ga)AlN compounds or alloy materials disposed on GaAs, InP, GaN, Si, SiC or Al2O3 substrates.

Other alternative embodiments may have a uniformly doped layer in the place of any pulse-doping layer, with the uniformly doped layer having the same polarity as the pulse-doping layer which is replaced. For example, if the front barrier 46 includes an n-doped pulse-doping layer, such an n-doped pulse-doping layer 60, then the pulse-doping layer 60 may be replaced with an n-doped uniformly doped layer.

The present invention may be embodied in other specific forms without departing from its spirit or essential characteristics. The described embodiments are to be considered in all respects only as illustrative and not restrictive. The scope of the invention, therefore, will be indicated by claims rather than by the foregoing description. All changes, which come within the meaning and range of equivalency of the claims, are to be embraced within their scope.

What is claimed is:

1. A field-effect transistor (FET) comprising:
a substrate;
a back barrier disposed on the substrate;
a middle barrier disposed above the back barrier, wherein at least one pulse-doping layer is disposed within the middle barrier;
a channel disposed on the middle barrier;
a front barrier disposed on the channel; and
a threshold-control terminal (TCT) access layer disposed between the middle barrier and the back barrier, wherein a voltage applied to the TCT access layer tunes a threshold voltage of the FET.

2. The FET of claim 1, further comprising:
a front hole-blocker layer disposed between the middle barrier and the TCT access layer.

3. The FET of claim 1, further comprising:
a spacer layer disposed between the middle barrier and the TCT access layer.

4. The FET of claim 1, further comprising:
a back hole-blocker layer disposed between the back barrier and the TCT access layer.

5. The FET of claim 1, further comprising:
a spacer layer disposed between the back barrier and the TCT access layer.

6. The FET of claim 1, wherein the front barrier includes at least one pulse-doping layer disposed therein.

7. The FET of claim 1, further comprising:
a substrate contact upon which the substrate is disposed.

8. The FET of claim 1, further comprising:
at least one counter-doped layer disposed between the channel and the middle barrier for modifying a threshold voltage of the FET.

9. The FET of claim 8, wherein at least the channel has an electrical current therein, and wherein a plurality of carriers of the electrical current are electron holes.

10. The FET of claim 1, wherein the channel is a doped channel which is depleted.

11. The FET of claim 10, further comprising:
a source terminal; and
a drain terminal;
wherein the channel is depleted by applying a voltage opposite in polarity to the ionized impurities serving as the dopants of the doped channel.

12. The FET of claim 11, wherein the FET is selected from a hetero-junction FET (HFET), a junction gate FET (JFET), and a metal-semiconductor FET (MESFET).

13. The FET of claim 1, wherein the substrate is composed of a compound selected from GaAs, InP, GaN, Si, SiC or Al2O3.

14. A field-effect transistor (FET) comprising:
a substrate;
a back barrier disposed on the substrate;
a middle barrier disposed above the back barrier, wherein at least one pulse-doping layer is disposed within the middle barrier;
a channel disposed on the middle barrier;
a front barrier disposed on the channel;
at least one counter-doped layer disposed between the channel and the middle barrier for modifying a threshold voltage of the FET; and
an n-doped threshold-control terminal (TCT) access layer disposed between the middle barrier and the back barrier, wherein a voltage applied to the TCT access layer tunes the threshold voltage of the FET.

15. A field-effect transistor (FET) comprising:
a substrate;
a back barrier disposed on the substrate;
a middle barrier disposed above the back barrier, wherein at least one pulse-doping layer is disposed within the middle barrier;
a channel disposed on the middle barrier;
a front barrier disposed on the channel; a p-doped threshold-control terminal (TCT) access layer, wherein a voltage applied to the TCT access layer tunes a threshold voltage of the FET;
a spacer layer; and
a hole-blocking layer;
wherein at least one of the p-doped TCT access layer, the spacer layer, the hole-blocking layer, the channel, the front barrier, the middle barrier, and the back barrier is composed of a compound selected from (In)GaAs, (In)GaP, (Ga)AlAs, (Al)InAs, (In)GaN or (Ga)AlN.

16. A field-effect transistor (FET) comprising:
a substrate;
a back barrier disposed on the substrate;
a threshold-control terminal (TCT) access layer disposed above the back barrier, wherein a voltage applied to the TCT access layer tunes a threshold voltage of the FET;
a middle barrier disposed above the TCT access layer, wherein at least one pulse-doping layer is disposed within the middle barrier;
a channel disposed on the middle barrier;
a front barrier disposed on the channel; and
a gate disposed on the front barrier.

17. The FET of claim 16, wherein the TCT access layer is p-doped.

18. The FET of claim 16, further comprising:
a TCT contact disposed on the TCT access layer.

* * * * *